United States Patent
Shimada

(10) Patent No.: US 8,274,166 B2
(45) Date of Patent: Sep. 25, 2012

(54) SEMICONDUCTOR DEVICE AND METHOD OF MANUFACTURING THE SAME

(75) Inventor: Hirokazu Shimada, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 370 days.

(21) Appl. No.: 12/458,278

(22) Filed: Jul. 7, 2009

(65) Prior Publication Data

US 2010/0007035 A1    Jan. 14, 2010

(30) Foreign Application Priority Data

Jul. 9, 2008   (JP) ................. 2008-179562

(51) Int. Cl.
*H01L 29/40* (2006.01)
(52) U.S. Cl. ............ 257/797; 257/758; 257/760
(58) Field of Classification Search ........ 257/758, 257/760, 797
See application file for complete search history.

(56) References Cited

U.S. PATENT DOCUMENTS

| | | | | |
|---|---|---|---|---|
| 5,329,423 A * | 7/1994 | Scholz | ............ | 361/760 |
| 5,726,502 A * | 3/1998 | Beddingfield | ............ | 257/797 |
| 6,452,284 B1 * | 9/2002 | Sheck | ............ | 257/797 |
| 6,821,878 B2 * | 11/2004 | Danvir et al. | ............ | 438/613 |
| 7,482,703 B2 | 1/2009 | Hwang et al. | | |
| 7,575,980 B2 * | 8/2009 | Kim | ............ | 438/401 |
| 2002/0027294 A1 * | 3/2002 | Neuhaus et al. | ............ | 257/778 |
| 2003/0052440 A1 * | 3/2003 | Tsuura | ............ | 267/100 |
| 2005/0218517 A1 * | 10/2005 | Capote et al. | ............ | 257/738 |
| 2006/0246648 A1 * | 11/2006 | Park et al. | ............ | 438/210 |
| 2007/0117343 A1 | 5/2007 | Hwang et al. | | |
| 2009/0045530 A1 * | 2/2009 | Bucchignano et al. | ............ | 257/797 |
| 2009/0206411 A1 * | 8/2009 | Koketsu et al. | ............ | 257/368 |

FOREIGN PATENT DOCUMENTS

JP    2007-142436 A    6/2007

* cited by examiner

*Primary Examiner* — James Mitchell
(74) *Attorney, Agent, or Firm* — McGinn IP Law Group, PLLC

(57) ABSTRACT

A semiconductor device includes a substrate; an alignment mark formed on the substrate and composed of a metal film; a cover insulating film formed on the alignment mark and covering an entire surface of the alignment mark; and a polyimide film formed on the cover insulating film, and having an opening, which is opened on the alignment mark and has an end face aligning with an end face of the alignment mark, in plan view.

16 Claims, 6 Drawing Sheets

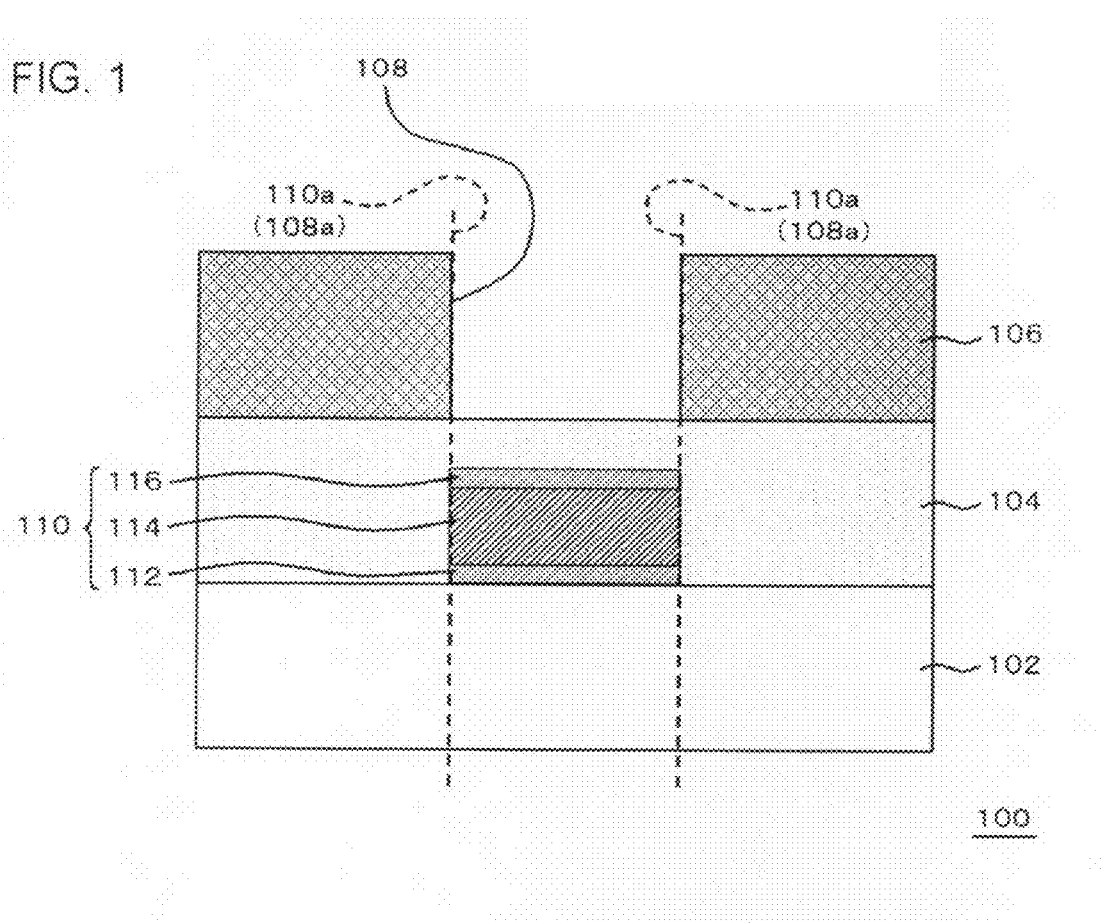

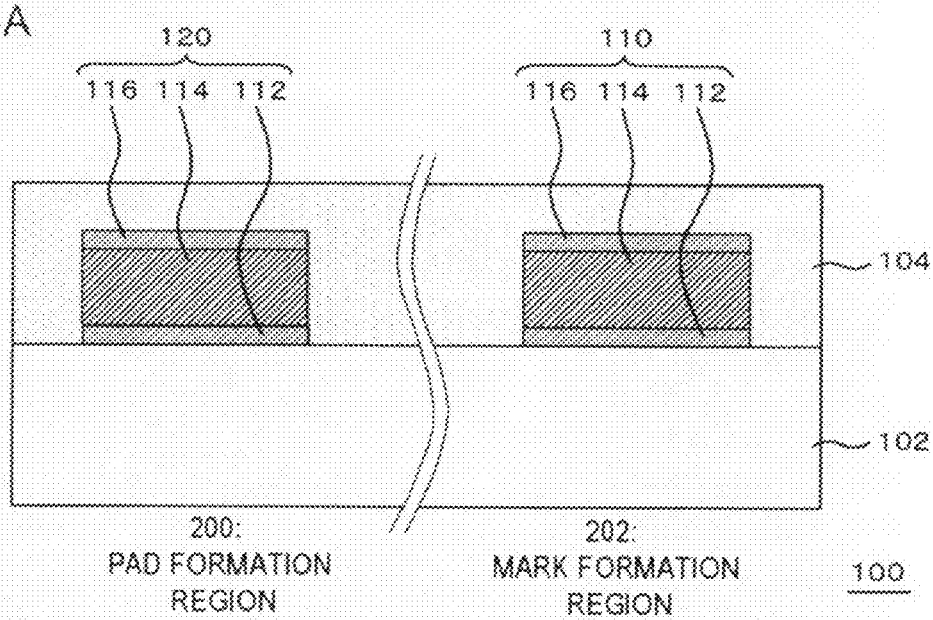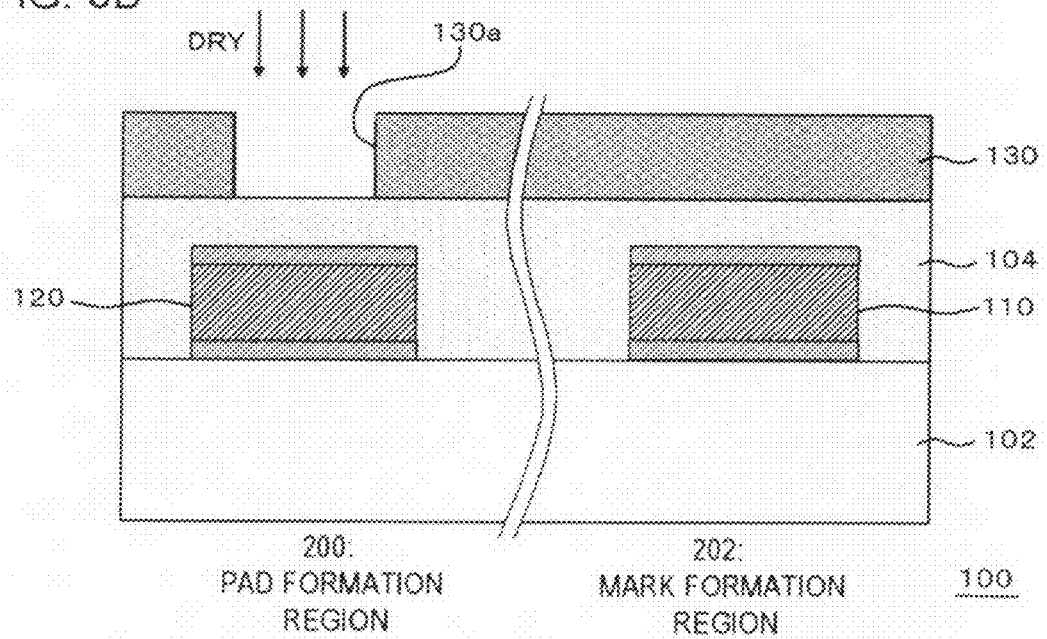

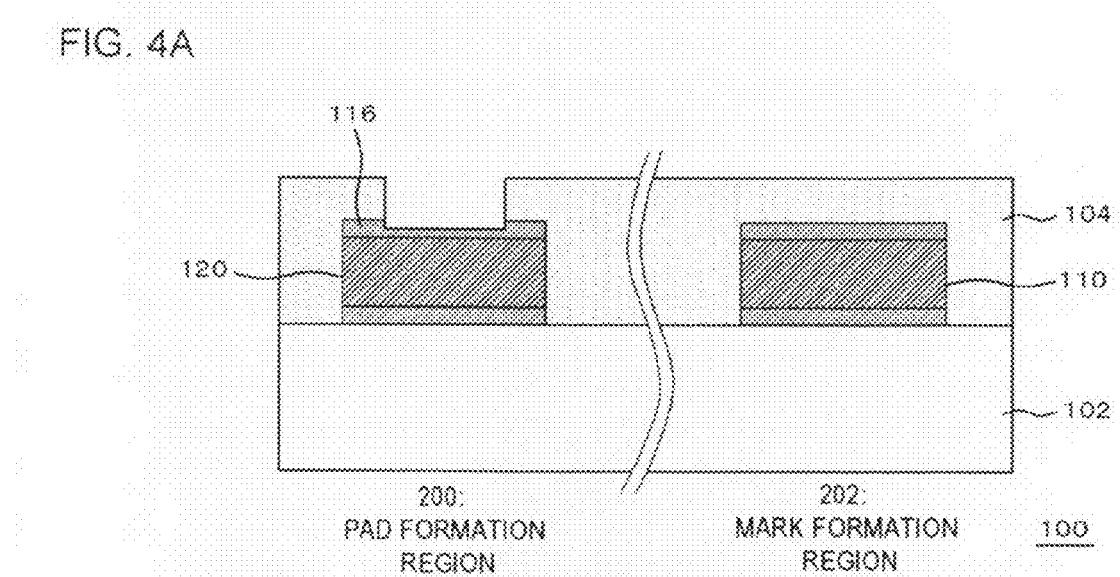
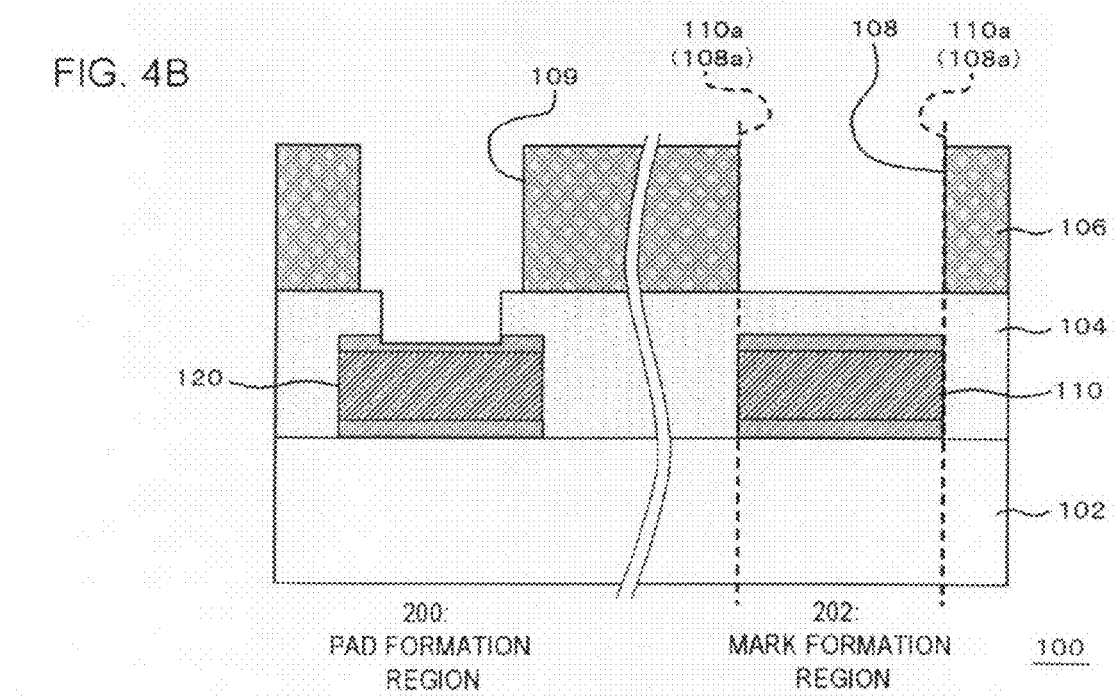

10

SEMICONDUCTOR DEVICE AND METHOD OF MANUFACTURING THE SAME

This application is based on Japanese patent application NO. 2008-179562, the content of which is incorporated hereinto by reference.

BACKGROUND

1. Technical Field

The present invention relates to a semiconductor device and a method of manufacturing the same.

2. Related Art

In recent years, in order to align a position of a semiconductor device, a technique for forming an alignment mark composed of a metal film on a semiconductor substrate has been known.

FIG. 5 is a cross-sectional view illustrating a configuration of a semiconductor element 10 that is disclosed in Japanese Laid-open patent publication NO. 2007-142436.

The semiconductor element 10 includes an alignment mark 55 that is formed on a semiconductor substrate 50, a passivation film 60 that is formed on the alignment mark 55, and a polyimide film 70 that is formed on the passivation film 60. In this case, the polyimide film 70 is patterned to expose the passivation film 60.

The present inventor has recognized as follows. According to the technique that is disclosed in Japanese Laid-open patent publication NO. 2007-142436, an end face 70a of the polyimide film 70 is formed having a margin from an end face 55a of the alignment mark 55, and thus alignment precision is lowered. FIG. 6A is a plan view illustrating the configuration of a semiconductor element 10 when an alignment mark 55 shown in FIG. 5 has a cross shape in plan view. Here, the passivation film 60 formed on the alignment mark 55 is not illustrated. FIG. 6B is a plan view illustrating an end face 55a of an alignment mark 55 and an end face 70a of an opening of a polyimide film 70. When the end face 70a of the polyimide film 70 and the end face 55a of the alignment mark 55 have the margin therebetween, the alignment mark may be viewed double, as shown in FIG. 6B. As such, if the alignment mark is viewed double, erroneous may be generated in recognition upon aligning a position, which may result in lowering alignment precision.

SUMMARY

In one embodiment, there is provided a semiconductor device, including: a substrate; an alignment mark formed on the substrate and composed of a metal film; a cover insulating film formed on the alignment mark and covering an entire surface of the alignment mark; and a polyimide film formed on the cover insulating film, and having an opening, which is opened on the alignment mark and has an end face aligning with an end face of the alignment mark, in plan view.

In another embodiment, there is provided a method of manufacturing a semiconductor device, including: forming an alignment mark which is composed of a metal film on a substrate; forming a cover insulating film on an entire surface of the alignment mark; and forming a polyimide film on an entire surface of the cover insulating film and patterning the polyimide film in a state where the cover insulating film remains on the entire surface of the alignment mark to form an opening opened on the alignment mark and has an end face aligning with an end face of the alignment mark, in plan view, in the polyimide film.

With this configuration, the contrast generated due to a level difference of the polyimide film can overlap the contrast of the alignment mark, and thus alignment precision can be improved.

Further, any combination of the components or modifications of the embodiments of the present invention made by changing expressions between that for a method and for a device may be included as embodiments of the present invention.

According to the present invention, it is possible to improve the alignment precision.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a cross-sectional view illustrating a configuration of a semiconductor device according to an embodiment of the present invention;

FIGS. 3A and 3B are process cross-sectional views illustrating a sequence of manufacturing a semiconductor device according to an embodiment of the present invention;

FIGS. 4A and 4B are process cross-sectional views illustrating a sequence of manufacturing a semiconductor device according to an embodiment of the present invention;

DETAILED DESCRIPTION

Figure 2A:
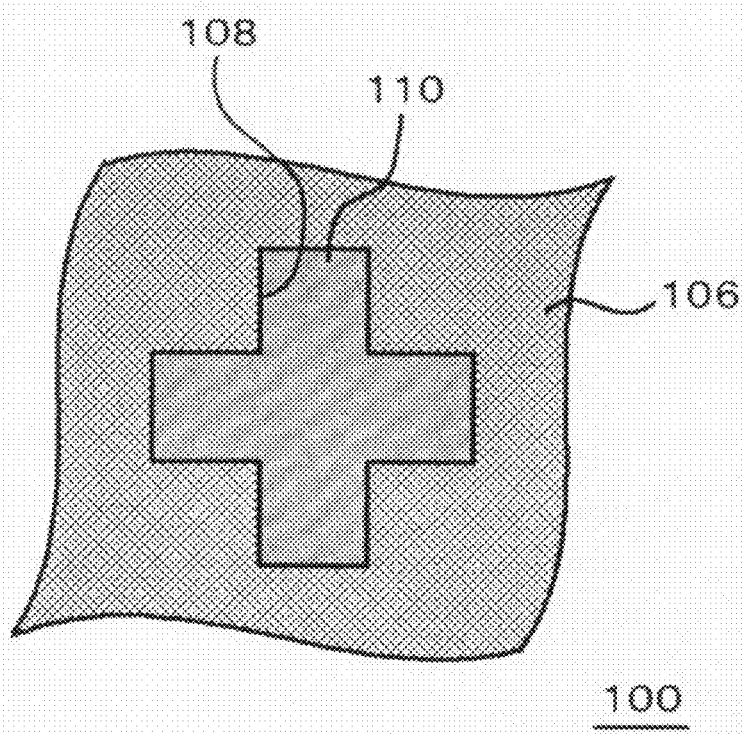
FIGS. 2A and 2B are plan views illustrating a configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, the preferred embodiments of the present invention will be described with reference to the accompanying drawings. Further, in all drawings, the same components will be denoted by the same reference numerals and the description thereof will not be repeated.

FIG. 1 is a cross-sectional view illustrating the configuration of a semiconductor device according to an embodiment. FIG. 2A is a plan view illustrating a semiconductor device.

The semiconductor device 100 includes a substrate 102, an alignment mark 110 formed on the substrate 102 and composed of a metal film, a cover insulating film 104 formed on the alignment mark 110 and covering an entire surface of the alignment mark 110, and a polyimide film 106 that is a passivation film formed on the cover insulating film 104. The substrate 102 may be a semiconductor substrate, such as a silicon substrate.

Further, a multilayer wiring film may be formed between the substrate 102 and a layer where the alignment mark 110 is formed, but is not described herein. The alignment mark 110 may be formed in an uppermost wiring layer of the semiconductor device 100.

In the polyimide film 106, an opening 108, which is opened on the alignment mark 110 and has an end face 108a aligning with an end face 110a of the alignment mark 110 in plan view, is formed.

Further, the alignment mark 110 may be composed of a laminated film where a barrier metal film 112, a wiring film 114, and a barrier metal film 116 are laminated in this order. In this case, the wiring film 114 may be formed of, for example, aluminum. Further, the barrier metal films 112 and 116 may be formed of, for example, TiN. In this embodiment, the alignment mark 110 may have a cross shape (for example, with a line width of 150 μm). Further, as another example, the alignment mark 110 may have an L shape or a T shape (for example, with a line width of 130 μm).

The cover insulating film 104 may be formed of a material having high transparency such as a $SiO_2$ film. The cover insulating film 104 is not shown in FIG. 2A. By forming the cover insulating film 104 of the material having high transparency, it is possible to grasp a shape of the alignment mark 110, as shown in FIG. 2A even when the cover insulating film 104 is formed on a surface of the alignment mark 110.

Figure 2B:
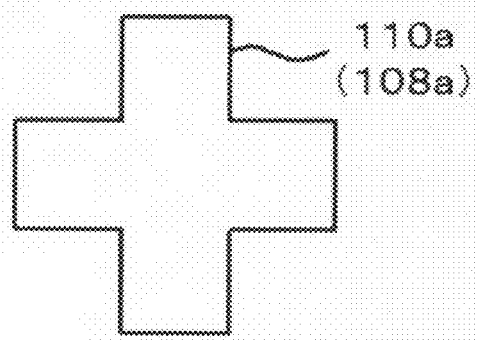
Figure 5:
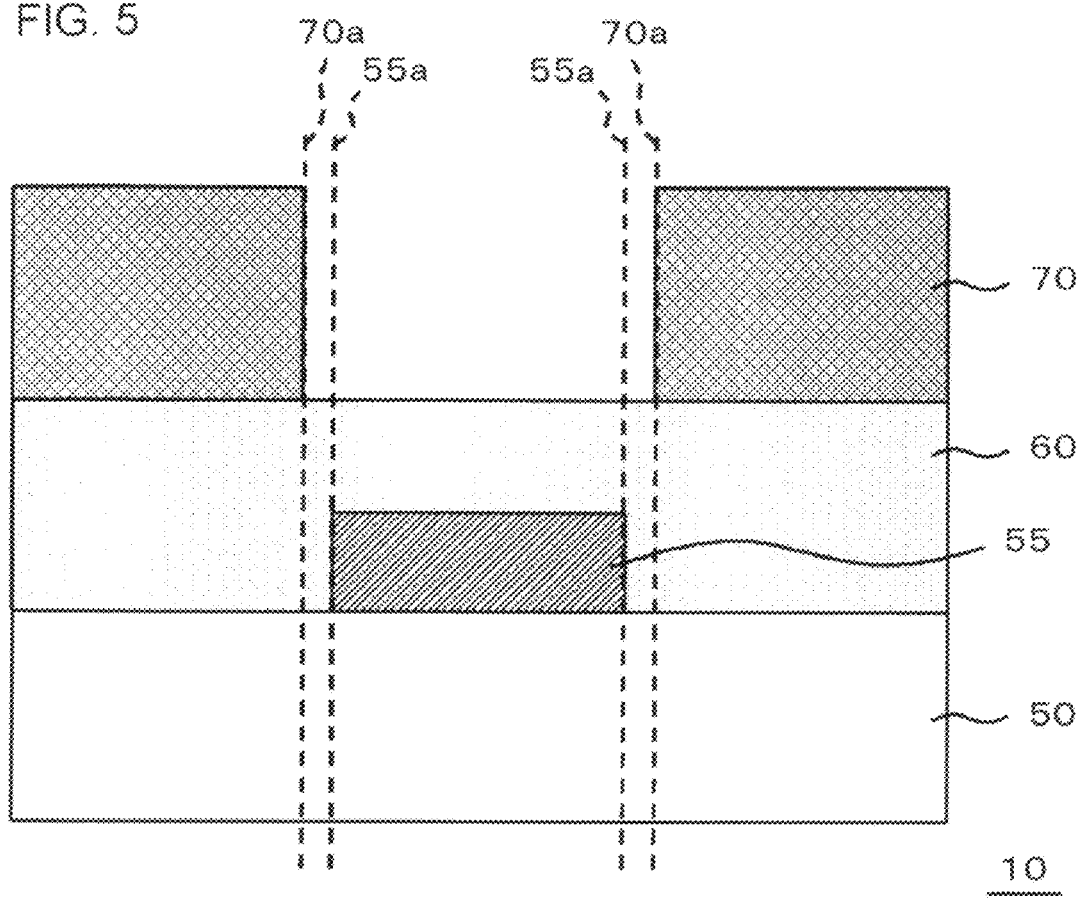
FIG. 5 is a cross-sectional view illustrating the configuration of a semiconductor element according to the related art.
Figure 6A:
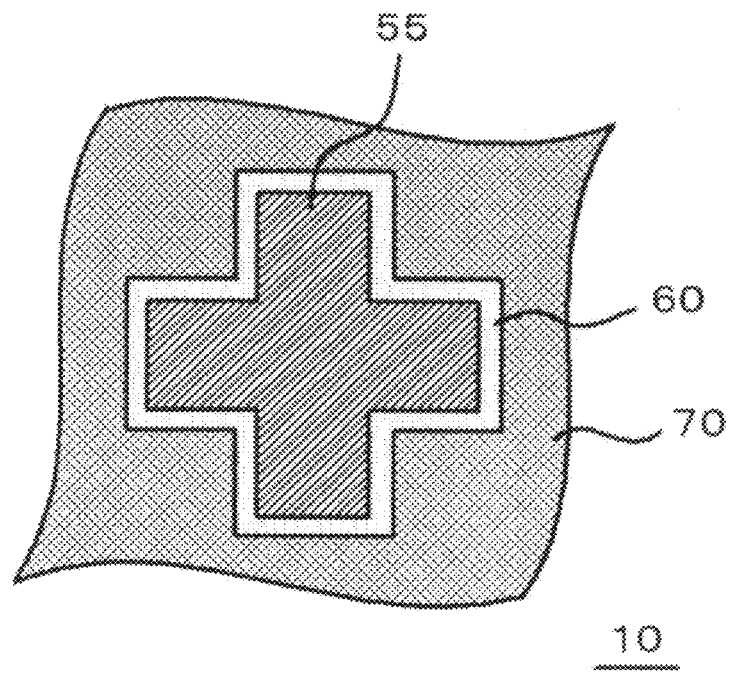
FIGS. 6A and 6B are plan views illustrating the configuration of the semiconductor element shown in FIG. 5.
Figure 6B:
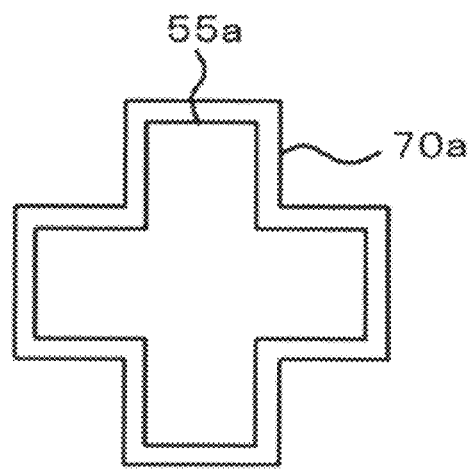

FIG. 2B is a plan view illustrating the end face 110a of the alignment mark 110 and the end face 108a of an opening 108 of the polyimide film 106. In this embodiment, the end face 108a of the opening 108 of the polyimide film 106 aligns with the end face 110a of the alignment mark 110. For this reason, as shown in FIG. 2B, it is possible to clarify contrast of an edge of the alignment mark 110 and thereby improving alignment precision.

Further, the cover insulating film 104 is formed to extend to reach an outer circumference over the end face 110a of the alignment mark 110. That is, sidewalls of the alignment mark 110 are covered with the insulating film 104 and protected thereby. As a result, it is possible to prevent the alignment mark 110 from corrosion due to chemical solutions or the like.

Further, in this embodiment, on the substrate 102, a pad electrode may be formed in the same layer as the alignment mark 110.

Next, a sequence of manufacturing the semiconductor substrate 100 will be described while the case where the alignment mark 110 and the pad electrode are formed on the substrate 102 is exemplified. FIGS. 3A to 4B are process cross-sectional views illustrating a sequence of manufacturing a semiconductor device 100 according to this embodiment.

In the semiconductor device 100, a pad formation region 200 where a pad electrode 120 is formed and a mark formation region 202 where the alignment mark 110 is formed are provided. In this case, the pad electrode 120 is formed in the pad formation region 200 on the substrate 102, and the alignment mark 110 is formed in the mark formation region 202. Here, the pad electrode 120 may include a measuring electrode pad, to which a probe contacts in order to measure an electrical characteristic of the semiconductor device 100, and an external connecting electrode pad for external connection using a conductive bump to be formed afterwards. Each of the alignment mark 110 and the pad electrode 120 is formed by forming the barrier metal film 112, the wiring film 114, and the barrier metal film 116 on the substrate 102 and patterning them in predetermined shapes, respectively. Here, between the substrate 102 and a layer where the alignment mark 110 and the pad electrode 120 are formed, a multilayer wiring film may be formed, although it is not shown.

Next, the cover insulating film 104 (having a film thickness of, for example, 1100 nm) is formed on the entire surface of the alignment mark 110 and the pad electrode 120 (refer to FIG. 3A). At this time, the cover insulating film 104 is formed to extend to reach an outer circumference over the end faces of the alignment mark 110 and the pad electrode 120 so as to cover the top surfaces and the side surfaces of the alignment mark 110 and the pad electrode 120.

Next, a resist film 130 is formed on the entire surface of the substrate 102 (refer to FIG. 3B). In this case, the resist film 130 may have the configuration where an opening 130a is formed, such that an opening is formed in the cover insulating film 104 on the pad electrode 120, only in the pad formation region 200.

The cover insulating film 104 is selectively etched by dry etching using such resist film 130 as a mask, thereby exposing the top surface of the pad electrode 120. At this time, the barrier metal film 116 of the top surface of the pad electrode 120 is also etched (refer to FIG. 4A). As a result, the film thickness of the barrier metal film 116 of the pad electrode 120, in a portion exposed from the cover insulating film 104, becomes smaller than that of the barrier metal film 116 of the alignment mark 110. With this configuration, it is possible to prevent the probe from being damaged when measuring an electrical characteristic by bringing the probe into contact with the top surface of the pad electrode 120.

Further, the opening 130a of the resist film 130 may be formed smaller than the pad electrode 120, in plan view. That is, the cover insulating film 104 can be opened such that its end face is located to reach an inner circumference over the end face of the pad electrode 120. As a result, the cover insulating film 104 can protect the pad electrode 120 such that the side surfaces of the pad electrode 120 are not exposed.

Then, the polyimide film 106 (having a film thickness of, for example, 7 μm) is formed on the entire surface of the cover insulating film 104 and the polyimide film 106 is patterned, thereby forming an opening 109 which is opened on the pad electrode 120 and an opening 108 which is opened on the alignment mark 110. In this case, the opening 108 is formed such that its end face 108a aligns with the end face 110a of the alignment mark 110, in plan view. Further, the opening 109 may be formed such that its end face is located to reach an outer circumference over that of the opening formed in the cover insulating film 104, however the opening 109 is not particularly limited thereto. Here, the end face of the opening 109 may align with the end face of the pad electrode 120 or may not align with the end face of the pad electrode 120.

In this embodiment, the polyimide film 106 may be formed of a photosensitive polyimide material. The polyimide film 106 having the opening 108 may be formed in accordance with the following sequence. First, a photosensitive polyimide film is coated on the entire surface of the cover insulating film 104. Next, in the photosensitive polyimide film, a pattern whose end face aligns with the end face 110a of the alignment mark 110 in plan view is exposed and developed, thereby forming the opening 108 in the polyimide film 106 (refer to FIG. 4B). Further, when the opening 108 is formed, the opening 109 may be also formed in the polyimide film 106 in the pad formation region 200.

According to the above processes, in the mark formation region 202, the cover insulating film 104 remains on the entire surface of the alignment mark 110. With such configuration where the top surface and the side surfaces of the alignment mark 110 are covered with the cover insulating film 104, it is possible to prevent the alignment mark 110 from corrosion due to chemical.

Next, after the electrical characteristic of the semiconductor device 100 is measured by bring the probe into contact with the measuring electrode pad of the pad electrode 120, the conductive bump or the like may be formed on the external connecting electrode pad of the pad electrode 120.

According to the semiconductor device 100 in this embodiment, the opening 108 of the polyimide film 106 formed on the alignment mark 110 is formed such that its end face 108a, which is an edge in plan view, aligns with the end face 110a of the alignment mark. For this reason, the contrast generated due to a level difference of the polyimide film 106 can overlap the contrast of the alignment mark 110, and thereby improving alignment precision. Accordingly, the alignment precision can be improved without depending on transparency of the cover insulating film 104, and thus the semiconductor device according to this embodiment has an advantage of an increased flexibility.

Further, since the cover insulating film 104 remains on the alignment mark 110, it is possible to prevent the alignment mark 110 from corrosion due to chemical.

Further, according to the method of manufacturing the semiconductor device in this embodiment, the opening 108 of the polyimide film 106 is formed by exposing and developing the photosensitive polyimide material. Therefore, the edge thereof can be formed with high precision. As a result, the alignment precision can be improved.

The preferred embodiments of the present invention have been described with reference to the accompanying drawings. However, the preferred embodiments are only exemplified and a variety of configurations other than that described above can be adopted.

It is apparent that the present invention is not limited to the above embodiment, and may be modified and changed without departing from the scope and spirit of the invention.

What is claimed is:

1. A semiconductor device, comprising:
    a substrate;
    an alignment mark disposed on said substrate, said alignment mark comprising a metal film;
    a cover insulating film disposed on said alignment mark, said cover insulating film covering an entire surface of said alignment mark;
    a pad electrode disposed in a same layer as said alignment mark on said substrate; and
    a polyimide film disposed on said cover insulating film, wherein said polyimide film comprises:
        a first opening, which is opened on said alignment mark, said first opening comprising an end face aligning flushly with an end face of said alignment mark, in plan view; and
        a second opening that is disposed in a region where said pad electrode is disposed and exposes a top surface of said pad electrode, and
        wherein said cover insulating film comprises an opening that is disposed in the region where said pad electrode is disposed and exposes the top surface of said pad electrode.

2. The semiconductor device according to claim 1, wherein said cover insulating film is disposed to extend to reach an outer circumference over said end face of said alignment mark.

3. The semiconductor device according to claim 1, wherein the first opening in the polyimide film further comprises a second end face aligning with a second end face of the alignment mark, in plan view.

4. The semiconductor device according to claim 1, wherein the alignment mark further comprises a wiring film disposed on the metal film.

5. The semiconductor device according to claim 1, wherein the pad electrode comprises a second metal film and a wiring film disposed on the second metal film.

6. The semiconductor device according to claim 1, wherein the polyimide film has a first contrast and the alignment mark has a second contrast, and the first and second contrasts overlap, in a top-down view.

7. The semiconductor device according to claim 1, wherein the top surface of the pad electrode comprises a second metal film.

8. The semiconductor device according to claim 7, wherein the second metal film of the pad electrode comprises a portion having a thickness that is less than a thickness of the metal film of the alignment mark.

9. The semiconductor device according to claim 1, wherein the pad electrode is disposed directly on the substrate.

10. The semiconductor device according to claim 1, wherein the alignment mark is disposed directly on the substrate.

11. The semiconductor device according to claim 1, wherein the opening in the cover insulating film partially overlaps the top surface of the pad electrode.

12. The semiconductor according to claim 11, wherein the top surface of the pad electrode, which is exposed by the opening in the cover insulating film, has a thickness that is less than a thickness of the top surface of the pad electrode that is partially overlapped by the cover insulating film.

13. The semiconductor according to claim 1, wherein the alignment mark further comprises a second metal film and a wiring film.

14. The semiconductor according to claim 13, wherein the wiring film is disposed between the metal film and the second metal film.

15. A semiconductor device, comprising:
    a substrate;
    an alignment mark disposed on said substrate comprising:
        a metal film;
    a cover insulating film disposed on said alignment mark, said cover insulating film covering an entire surface of said alignment mark;
    a pad electrode disposed in a same layer as said alignment mark on said substrate; and
    a polyimide film disposed on said cover insulating film, said polyimide film comprising:
        an opening, which is opened on said alignment mark, said opening comprising an end face aligning flushly with an end face of said alignment mark, in plan view; and
        an opening that is disposed also in a region where said pad electrode is disposed and exposes a top surface of said pad electrode,
    wherein said cover insulating film comprises an opening that is disposed also in a region where said pad electrode is disposed and exposes the top surface of said pad electrode, and
    wherein each of said alignment mark and said pad electrode includes a wiring film and a barrier metal film disposed on the wiring film, and said barrier metal film of said pad electrode, in a portion that is exposed from said cover insulating film, has a film thickness smaller than that of said barrier metal film of said alignment mark.

16. The semiconductor device according to claim 15, wherein said wiring film comprises an aluminum film.

* * * * *